(12) United States Patent
Momann et al.

(10) Patent No.: US 10,165,692 B2
(45) Date of Patent: Dec. 25, 2018

(54) ELECTRICAL DEVICE

(71) Applicant: SEW-EURODRIVE GMBH & CO. KG, Bruchsal (DE)

(72) Inventors: Dirk Momann, Bruchsal (DE); Alexander Kolbert, Weingarten (DE)

(73) Assignee: SEW-EURODRIVE GMBH & CO. KG, Bruchsal (DE)

(*) Notice: Subject to any disclaimer, the term of this patent is extended or adjusted under 35 U.S.C. 154(b) by 0 days.

(21) Appl. No.: 15/547,429

(22) PCT Filed: Dec. 18, 2015

(86) PCT No.: PCT/EP2015/002559
§ 371 (c)(1),
(2) Date: Jul. 28, 2017

(87) PCT Pub. No.: WO2016/119807
PCT Pub. Date: Aug. 4, 2016

(65) Prior Publication Data
US 2018/0035557 A1  Feb. 1, 2018

(30) Foreign Application Priority Data

Jan. 28, 2015 (DE) .................. 10 2015 000 938

(51) Int. Cl.
*H05K 1/11* (2006.01)
*H05K 5/00* (2006.01)
(Continued)

(52) U.S. Cl.
CPC ......... *H05K 5/0069* (2013.01); *H05K 1/0286* (2013.01); *H05K 1/115* (2013.01);
(Continued)

(58) Field of Classification Search
CPC ...... H05K 5/0069; H05K 5/0213; H05K 5/04; H05K 1/115
See application file for complete search history.

(56) References Cited

U.S. PATENT DOCUMENTS 4,686,506 A * 8/1987 Farago ............... G06F 13/38
                                              341/100
5,497,289 A   3/1996 Sugishima et al.
(Continued)

FOREIGN PATENT DOCUMENTS

DE   43 33 387 A1   3/1994
DE   199 83 152 T1   5/2001
(Continued)

OTHER PUBLICATIONS

International Search Report dated May 9, 2016, in International Application No. PCT/EP2015/002559. (English-language translation).
(Continued)

*Primary Examiner* — Hoa C Nguyen
*Assistant Examiner* — Christopher L Augustin
(74) *Attorney, Agent, or Firm* — Hunton Andrews Kurth LLP

(57) ABSTRACT

An electrical device, for example, a converter, includes: a first circuit board, which includes first circuit traces and at least one plated-through hole, a second circuit board, which includes second circuit traces and at least one connection device, a power module, and a plug-connector part. The power module is placed on the first circuit board and is connected in an electrically conductive manner to the plated-through hole with the aid of the first circuit traces, the plug-connector part is placed on the second circuit board and is connected in an electrically conductive manner to the connection device with the aid of the second circuit traces, and the plated-through hole is connected in an electrically (Continued)

conductive manner with the aid of a cable to the connection device.

16 Claims, 2 Drawing Sheets

(51) Int. Cl.
    *H05K 1/02*     (2006.01)
    *H05K 7/14*     (2006.01)
    *H05K 5/02*     (2006.01)
    *H05K 5/04*     (2006.01)

(52) U.S. Cl.
    CPC ............ *H05K 5/0213* (2013.01); *H05K 5/04* (2013.01); *H05K 7/1432* (2013.01); *H05K 2201/049* (2013.01); *H05K 2201/10166* (2013.01); *H05K 2201/10189* (2013.01); *H05K 2201/10287* (2013.01)

(56) References Cited

U.S. PATENT DOCUMENTS

| | | | |
|---|---|---|---|
| 6,320,776 | B1 | 11/2001 | Kajiura et al. |
| 6,466,447 | B2 | 10/2002 | Murowaki et al. |
| 7,316,574 | B2 | 1/2008 | Che et al. |
| 9,338,915 | B1* | 5/2016 | Liu ........................... H05K 1/18 |
| 9,924,595 | B2* | 3/2018 | Lee ........................ H05K 1/115 |
| 2001/0017766 | A1* | 8/2001 | Murowaki ............ H05K 1/147 361/752 |
| 2006/0121722 | A1* | 6/2006 | Card ...................... H05K 1/115 438/622 |
| 2008/0280495 | A1 | 11/2008 | Ko |
| 2009/0321110 | A1* | 12/2009 | Huang .................. B81B 7/0006 174/254 |
| 2013/0039019 | A1* | 2/2013 | Lu ............................ H05K 7/02 361/736 |
| 2013/0330941 | A1* | 12/2013 | Jeon ..................... H01R 12/585 439/65 |
| 2014/0192498 | A1* | 7/2014 | Rathburn .......... H01L 23/49822 361/767 |
| 2014/0268589 | A1* | 9/2014 | Nakamura ........... H05K 1/0206 361/748 |
| 2016/0174373 | A1* | 6/2016 | Lee ........................ H05K 1/147 361/748 |

FOREIGN PATENT DOCUMENTS

| | | |
|---|---|---|
| DE | 101 08 767 A1 | 8/2001 |
| DE | 695 23 374 T2 | 7/2002 |
| DE | 10 2005 062 770 A1 | 7/2006 |
| DE | 10 2005 054 601 A1 | 5/2007 |
| EP | 0 688 092 A2 | 12/1995 |

OTHER PUBLICATIONS

International Preliminary Report on Patentability, dated Aug. 1, 2017, in International Application No. PCT/EP2015/002559. (English-language translation).

\* cited by examiner

ELECTRICAL DEVICE

FIELD OF THE INVENTION

The present invention relates to an electrical device, especially a converter.

BACKGROUND INFORMATION

An electrical device having plug connectors is described in German Published Patent Application No. 10 2005 054 601.

SUMMARY

Example embodiments of the present invention provide an electrical device, which offers better protection of the environment.

According to an example embodiment of the present invention, an electrical device, e.g., a converter, includes: a first circuit board, which includes first circuit traces and at least one plated-through hole, a second circuit board, which includes second circuit traces and at least one connection device, a power module, and a plug-connector part.

The power module is placed on the first circuit board and is connected to the plated-through hole in an electrically conductive manner with the aid of the first circuit traces, the plug-connector part is placed on the second circuit board and is connected to the connection device in an electrically conductive manner with the aid of the second circuit traces, and the plated-through hole is connected to the connection device in an electrically conductive manner with the aid of a cable.

This has the advantage that the electrical device may have a compact design because the circuit boards are able to be placed at a distance from each other. The circuit boards may be set apart in the normal direction to a circuit board plane, e.g., parallel to each other.

The position of the plug connector on the electrical device is able to be selected independently of the position of the first circuit board in the electrical device.

The second circuit board may have a smaller size than the first circuit board.

Circuit board material may be able to be saved, which is better for the environment.

An end region of the cable may be inserted into the plated-through hole and connected to the plated-through hole by soldering. This is considered advantageous insofar as the cable is able to be connected to the plated-through hole in a reliable and uncomplicated manner.

The connection device may be placed on the second circuit board. This has the advantage that the connection device projects from the circuit board plane of the second circuit board. Thus, the cable is able to be plugged onto the connection device. The cable may extend in the transverse direction to the normal direction of the circuit board plane of the second circuit board. As a result, a fracture of the cable is preventable in a compact design of the electrical device, and the safety of the electrical device is improved.

The second circuit board may have a circuit board plane, and the connection device may project from the second circuit board perpendicular to the normal direction of the circuit board plane. This is considered advantageous insofar as the connection device extends farther into an interior space of the electrical device than the second circuit board. Thus, the cable is able to be placed at a distance from the second circuit board. The cable may extend substantially parallel to the normal direction of the circuit board plane.

Another end region of the cable may be plugged onto the connection device. This has the advantage that the cable is reliably and easily connectable to the connection device. The cable may be connected to the connection device by crimping, in particular using a crimp connector.

The connection device may be implemented as a through-plated hole in the second circuit board. This has the advantage that the plated-through hole is able to be produced in a single working step together with the second circuit traces on the second circuit board. The required work is thereby able to be reduced and the environment is better protected.

A further end region of the cable may be inserted into the connection device and may be connected to the connection device by soldering. This is considered advantageous insofar as the cable is able to be connected to the connection device in a reliable and uncomplicated manner.

An additional power module and an additional plug-connector part may be placed on the first circuit board, and the first circuit board may include further circuit traces, and the additional power module may be connected to the additional plug-connector part by the further circuit traces. This has the advantage that the device is able to supply two electric motors independently of each other. In an advantageous manner, an identical circuit board layout may be used for an electrical device for the supply of one electric motor and for an electrical device for the supply of two electric motors. Thus, a building block system for converters that has a reduced number of parts is able to be provided, and the environment is better protected.

The electrical device may have a single direct voltage intermediate circuit to which the power module and the additional power module are connected in an electrically conductive manner, and from which the power modules are supplied, in particular. This is considered advantageous insofar as an individual electric motor is able to be supplied from each power module. Electrical energy, which is produced by an electric motor in a generator operating mode, may be able to be injected into the other electric motor. Thus, an energy circuit is set up, and the environment is better protected.

The direct voltage intermediate circuit may have a single capacitor. This is considered advantageous insofar as electrical components are able to be saved, which is better for the environment.

The electrical device may include at least one housing component; the housing component may include at least one recess, and the plug-connector part may be at least partially guided through the recess. This has the advantage that the plug-connector part is easily connectable to the housing component, in particular by a clip-in connection.

The additional plug-connector part may be at least partially guided through the recess or through an additional recess. This is considered advantageous insofar as the additional plug-connector part is able to be easily connected to the housing component, in particular by a clip-in connection.

The second circuit board may be reversibly connected to the housing component. This has the advantage that the second circuit board is able to be exchanged in an uncomplicated manner.

A retaining part may be situated on the housing component, and especially is connected to the housing component in a form-locking manner, in particular by rivets, and the second circuit board may be reversibly connected to the retaining part, in particular with the aid of a screw part. This is considered advantageous insofar as the second circuit board is easily connectable to the housing component with the aid of the retaining part.

The housing component may device a plane situated at a non-vanishing angle to the circuit board plane of the second circuit board.

The connection device and/or the cable may be able to be set apart from the housing component with the aid of the retaining part.

The retaining part may be arranged as a stamped and bent part, and in particular, as a stamped and bent sheet metal part.

The second circuit board may be connected to the housing component in an electrically conductive manner with the aid of the retaining part and the screw part. This is considered advantageous insofar as the second circuit board is able to be connected to ground with the aid of the grounded housing component.

The housing component may include recesses for ventilation purposes, in particular for ventilating the electrical device. This is considered advantageous insofar as electrical components placed on the first circuit board are able to be cooled convectively or cooled by a ventilator, which improves the safety.

The housing component may be arranged as a sheet metal part, in particular as a stamped and bent sheet metal part, and the recesses for the ventilation and the recess and/or the additional recess may be arranged as cutouts in the sheet metal part. This is considered advantageous insofar as the production of the housing component is uncomplicated.

Additional features and aspects of example embodiments of the present invention are described in greater detail with reference to the the Figures.

DETAILED DESCRIPTION

Figure 1:
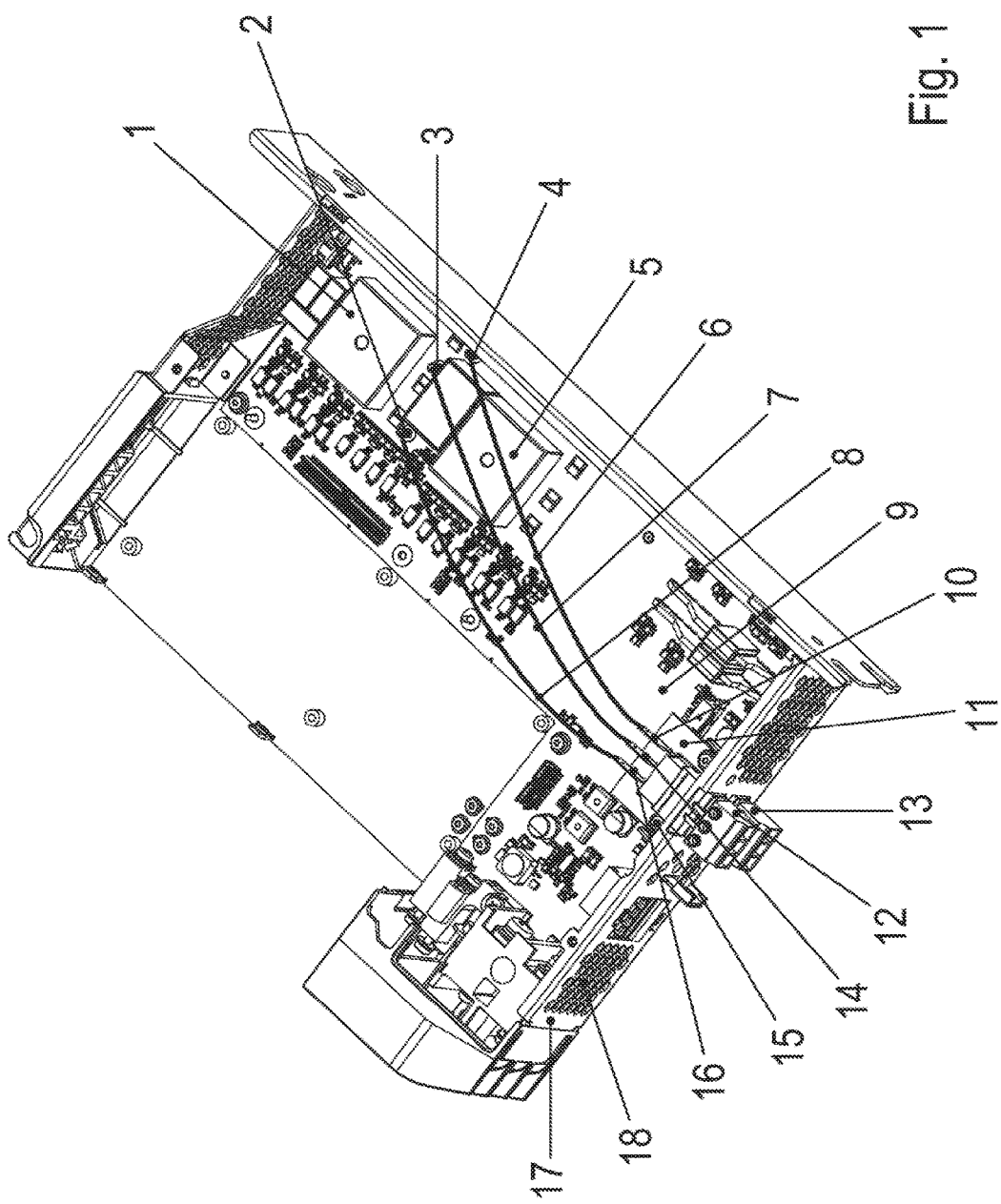
FIG. 1 shows an electrical device according to an example embodiment of the present invention in an oblique view.
Figure 2:
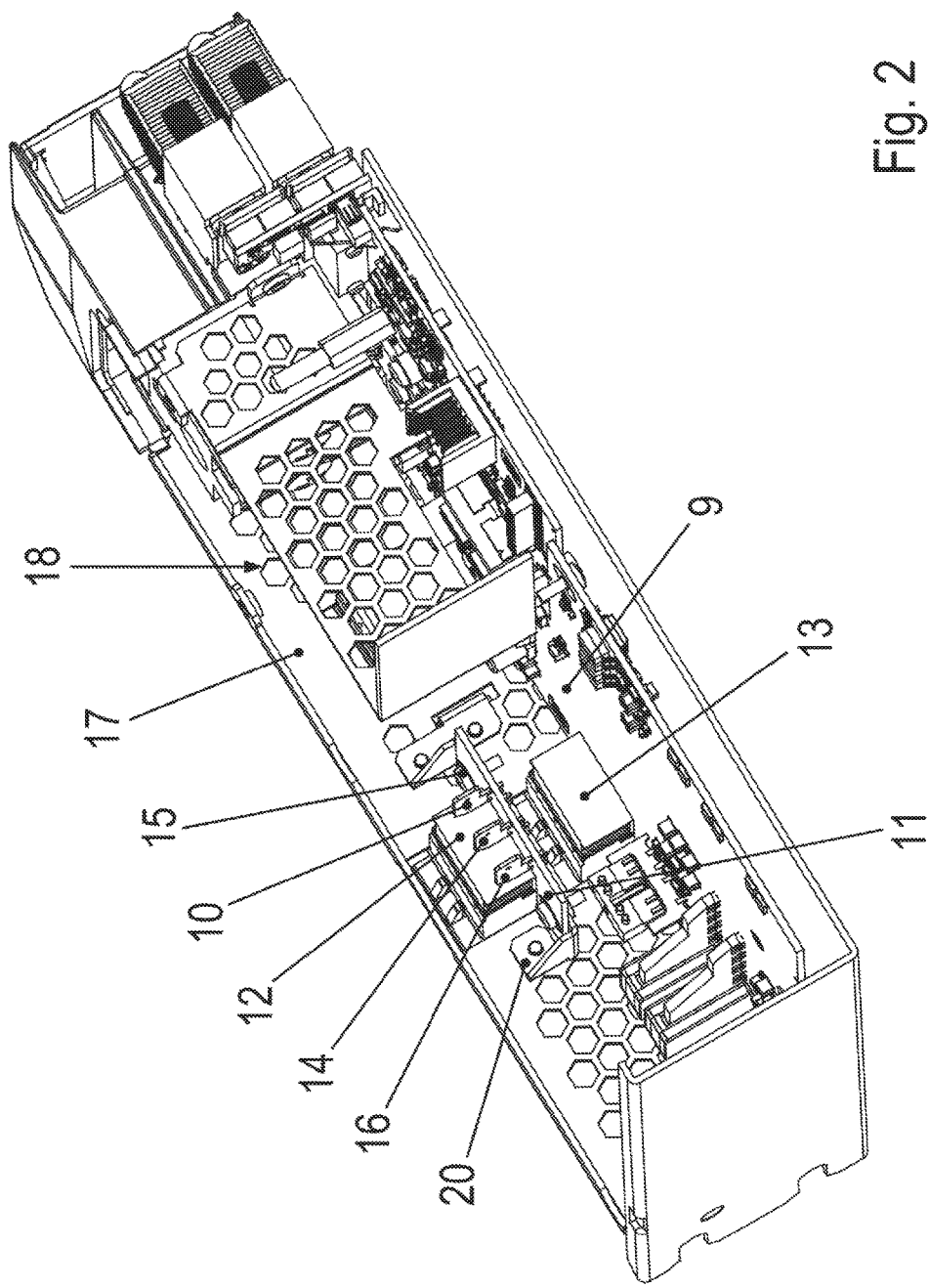
FIG. 2 shows a sectional view of the electrical device.

The electrical device according to an example embodiment of the present invention, e.g., a converter, has a first circuit board 9 on which a power module 5 and an additional power module 1 are situated.

Each power module (1, 5) has an inverter, which includes controllable semiconductor power switches, in particular IGBTs.

The electrical device has a rectifier and a direct voltage intermediate circuit, which is supplied therefrom. Both power modules (1, 5) may be supplied from a single shared direct voltage intermediate circuit.

Power module 5 is connected to three plated-through holes (2, 3, 4) in first circuit board 9 by first circuit traces on first circuit board 9. Power module 5 includes electrical contact devices for this purpose, which are connected to the first circuit traces by soldering.

Plated-through holes (2, 3, 4) are each electrically conductively connected to a separate cable (6, 7, 8). A respective first end region of each cable (6, 7, 8) is inserted into the respective plated-through hole (2, 3, 4) for this purpose and connected by soldering to respective plated-through hole (2, 3, 4).

A second end region of each cable (6, 7, 8) is connected in an electrically conductive manner to a respective connection device (10, 14, 16). The connection devices (10, 14, 16) are situated, in particular mounted, on a second circuit board 11. A plug-connector part 12 is fitted on second circuit board 11. The connection devices (10, 14, 16) are electrically conductively connected to plug-connector part 12 with the aid of two circuit traces on second circuit board 11. Connection devices (10, 14, 16) and plug-connector part 12 are provided with electrical contact devices for this purpose, which are connected to the second circuit traces by soldering.

Plug-connector part 12 is designed to be connected to a mating plug connector part. The mating plug-connector part, for example, is connected to an electric motor in an electrically conductive manner so that the electric motor is able to be supplied with the aid of the electrical device, in particular is able to be supplied from power module 5.

The electrical device includes at least one housing component 17. Plug-connector part 12 is partially guided through a recess in housing component 17 and connected to housing component 17 and/or second circuit board 11, in particular in a force-locking manner, preferably by clamping.

Second circuit board 11 is connected to housing component 17 in a reversible manner. At least one retaining part 20 is connected to housing component 17 for that purpose, in particular by rivets. Retaining part 20 includes at least one bore through which a screw part 15 is able to be guided. Second circuit board 11 includes at least one bore through which screw part 15 is able to be guided. Using screw part 15, which is guided through the bores and may be fixed in place with the aid of a nut, second circuit board 11 is reversibly connected to retaining part 20.

Retaining part 20 is arranged as a stamped and bent part, in particular as a stamped and bent sheet metal part. Housing component 17 defines a plane. Second circuit board 11 may be connected to housing component 17 such that this plane is situated at a non-vanishing angle to the circuit board plane of second circuit board 11; the circuit board plane of second circuit board 11 may be situated at a right angle to the plane of housing component 17. The retaining parts 20, situated on second circuit board 11, are set apart from housing component 17.

Additional power module 1 is connected in an electrically conductive manner to an additional plug-connector part 13 by circuit traces on first circuit board 9. Additional plug-connector part 13 is designed to be connected to another mating plug-connector part. For example, the mating plug-connector part is connected to an additional electric motor in an electrically conductive manner, so that the additional electric motor is able to be supplied by the electrical device, and is able to be supplied from additional power module 1, in particular.

Additional plug-connector part 13 is partially guided through a further recess in housing component 17 and connected to housing component 17 and/or to first circuit board 9, in particularly by friction-locking, and preferably by clamping.

Housing component 17 includes recesses for ventilation 18. The recesses for ventilation 18 are designed for ventilating, in particular for convectively cooling, the electrical device.

Housing component 17 is arranged as a stamped and bent part, in particular as a stamped and bent sheet metal part.

The recess, the additional recess, and the recesses for ventilation 18 are arranged in the form of uninterrupted recesses.

LIST OF REFERENCE NUMERALS 1 power module
2 plated-through hole 3 plated-through hole
4 plated-through hole
5 power module
6 cable
7 cable
8 cable
9 circuit board
10 connection device
11 circuit board
12 plug-connector part
13 plug-connector part
14 connection device
15 screw part
16 connection device
17 housing component
18 recess for ventilation
20 retaining part

The invention claimed is:

1. An electrical device, comprising:
a first circuit board including first circuit traces and at least one plated-through hole;
a second circuit board including second circuit traces and at least one connection device;
a power module;
a plug-connector part; and
an additional power module and an additional plug-connector part provided on the first circuit board;
wherein the power module is arranged on the first circuit board and is connected in an electrically conductive manner to the plated-through hole by the first circuit traces;
wherein the plug-connector part is arranged on the second circuit board and is connected in an electrically conductive manner to the connection device by the second circuit traces;
the plated-through hole is connected in an electrically conductive manner to the connection device by a cable; and
wherein the first circuit board includes further circuit traces, the additional power module being connected by the further circuit traces to the additional plug-connector part.

2. The electrical device according to claim 1, wherein the electrical device is arranged as a converter.

3. The electrical device according to claim 1, wherein an end region of the cable is inserted into the plated-through hole and is solder-connected to the plated-through hole.

4. The electrical device according to claim 1, wherein: (a) the connection device is arranged on the second circuit board; and/or (b) the second circuit board has a circuit board plane and the connection device projects from the second circuit board perpendicular to a normal direction of the circuit board plane.

5. The electrical device according to claim 4, wherein a further end region of the cable is plugged onto the connection device.

6. The electrical device according to claim 1, wherein: (a) the connection device includes a plated-through hole in the second circuit board; and/or (b) a further end region of the cable is inserted into the connection device and is solder-connected to the connection device.

7. The electrical device according to claim 1, further comprising a single direct voltage intermediate circuit to which the power module and the additional power module are connected in an electrically conductive manner, and from which the power modules are supplied.

8. The electrical device according to claim 7, wherein the direct voltage intermediate circuit includes a single capacitor.

9. The electrical device according to claim 1, (a) further comprising at least one housing component including at least one recess, (b) the plug-connector part being at least partially guided through the recess, and/or (c) the additional plug-connector part being at least partially guided through the recess or through an additional recess.

10. The electrical device according to claim 9, wherein the second circuit board is connected to the housing component in a reversible manner.

11. The electrical device according to claim 9, further comprising a retaining part (a) arranged on the housing component, (b) connected to the housing component in a form-locking manner, and/or (c) connected to the housing component by rivets, and wherein the second circuit board is (a) reversibly connected to the retaining part and/or (b) reversibly connected to the retaining part by a screw part.

12. The electrical device according to claim 11, wherein the second circuit board is connected to the housing component in an electrically conductive manner by the retaining part and the screw part.

13. The electrical device according to claim 9, wherein the housing component includes recesses for ventilation and/or ventilation of the electrical device.

14. The electrical device according to claim 9, wherein the housing component includes (a) a sheet metal part and/or (b) a stamped and bent sheet metal part, and wherein at least one ventilation recess is arranged as a cutout in the sheet metal part.

15. The electrical device according to claim 1, wherein each power module is adapted to independently feed a respective electric motor.

16. The electrical device according to claim 1, wherein the connector parts are adapted to connect to a mating connector part of an electric motor.

* * * * *